Figure 1:
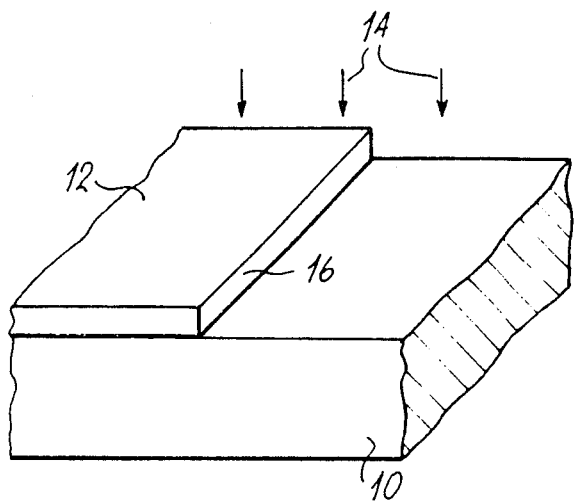

United States Patent [19]

Bouadma

[11] Patent Number: 4,865,684

[45] Date of Patent: Sep. 12, 1989

[54] PROCESS FOR PRODUCING A SEMICONDUCTOR LASER MIRROR BY IONIC MACHINING

[76] Inventor: Noureddine Bouadma, 17, rue du vol de Norne 94250, Gentilly, France

[21] Appl. No.: 158,071

[22] Filed: Feb. 12, 1988

Related U.S. Application Data

[63] Continuation of Ser. No. 808,448, filed as PCT FR85/00072 on Apr. 1, 1985, published as WO85/04529 on Oct. 10, 1985, abandoned.

[30] Foreign Application Priority Data

Apr. 3, 1984 [FR] France ................................ 84 05223

[51] Int. Cl.[4] .................... H01L 21/308; H01S 3/19
[52] U.S. Cl. .................................. 156/643; 156/647; 156/648; 156/659.1; 156/662; 437/129; 437/228; 437/962; 204/192.34
[58] Field of Search .............. 156/630, 631, 643, 647, 156/648, 659.1, 661.1, 662; 204/192.34, 192.35, 192.37; 437/129, 225, 228, 249, 962; 148/DIG. 95, DIG. 106

[56] References Cited

U.S. PATENT DOCUMENTS

| | | | |
|---|---|---|---|
| 4,248,688 | 2/1981 | Gartner et al. | 156/643 X |
| 4,354,898 | 10/1982 | Coldren et al. | 156/647 |
| 4,397,711 | 8/1983 | Donnelly et al. | 156/643 |
| 4,547,956 | 10/1985 | Bouadma et al. | 437/129 |

FOREIGN PATENT DOCUMENTS 0073548 3/1983 European Pat. Off. .
3138704 4/1983 Fed. Rep. of Germany .

OTHER PUBLICATIONS

Coldren et al., "GaInAsP/InP Stripe-Geometry Laser with a Reactive Ion-Etched Facet", Applied Physics Letters, vol. 37, No. 8, pp. 581-583, 15 Oct. 1980.
Mikami et al., "CW Operation of 1.5 μm GaInAsP/InP Buried-Heterostructure Laser . . . ", Electronic Letters, vol. 19, No. 6, pp. 213-215, Mar. 1983.
Demidov et al., "Bulk Waveguide Resonators for the Ultraviolet Part of the Spectrum", Soviet Journal of Quantum Electronics, vol. 13, No. 4, pp. 551-554, Apr. 1983.
Bouadma, "GaAs-GaAlAs DH Lasers with Ion Beam-Etched Facet", Second European Conference on Integrated Optics, Conference Pub. No. 227, pp. 24-26.

Primary Examiner—David L. Lacey
Assistant Examiner—Andrew J. Anderson
Attorney, Agent, or Firm—Oblon, Fisher, Spivak, McClelland & Maier

[57] ABSTRACT

A semiconductor (10) is subject to ionic etching (14) through a mask, whereof one side determines the location of the mirror. This mask is constituted by a crystalline layer (12), whereof the side (16) is a crystallographic plane.

2 Claims, 6 Drawing Sheets

PROCESS FOR PRODUCING A SEMICONDUCTOR LASER MIRROR BY IONIC MACHINING

This application is a continuation of application Ser. No. 808,448, filed as PCT FR85/00072 on Apr. 1, 1985, published as WO85/04529 on Oct. 10, 1985, now abandoned.

The present invention relates to a process for producing a semiconductor laser mirror by ionic machining.

The technical field of the invention is that of semiconductor lasers said to be with a double heterostructure and ribbon geometry. A double heterostructure is constituted by a stack of films of different semiconductor alloys, said films being deposited on a mono crystalline substrate, either by gaseous or liquid phase epitaxy, or by molecular jet.

In order to permit continuous operation at ambient temperature, the active region in which are confined both the light radiation and the electron - hole pairs is in the form of a ribbon or tape, whose width is approximately 10 microns and whose length is between 100 and 300 microns. This is the length which separates the two cleaved faces of the crystal, said faces forming the mirrors of the resonant cavity of the laser.

The preferred field of use for semiconductor lasers is that of optical telecommunications. For lasers emitting between 0.8 and 0.9 $\mu$m, the materials forming the films or layers of the double heterostructure are taken from family of ternary solid solutions of general formula $Ga_{1-x}Al_xAs$ in which x is between 0 and 1. The layers undergo epitaxy on a GaAs substrate. For wavelengths exceeding 1 $\mu$m, the materials forming the layers are taken from the family of quaternary solid solutions of general formula $Ga_{1-x}In_xAs_{1-y}P_y$, in which y is between 0 and 1. The layers undergo epitaxy on a InP substrate.

With a view to achieving monolithic integration of the laser and for producing various optical and electronic components, research has been carried out to attempt to produce laser resonant cavity without using the method of cleaving the faces of the crystal. Different solutions have been proposed and consist either of using high resolution defraction gratings (distributed rection lasers or distributed Bragg defraction lasers) or machining the reflecting faces by chemical etching or reactive plasma.

This prior art concerning the production of mirrors by a process other than the cleaving of the crystal faces has formed the subject matter of numerous publications, which can be classified into three categories. The first category is that in which the laser mirrors are obtained by wet chemical etching and reference should be made here to the works published by J. L.Merz and R. A.Logan in "Journal of Applied Physics", Vol 47, p 3503, 1976 concerning GaAs lasers and by K. Iga and B. I. Miller in "IEEE Journal of Quantum Electronics", Vol Qe-28, p 22, 1983 concerning InP lasers. The second category involves mirrors being produced by dry chemical etching (RIE) and reference should be made here to the works published by Coldren et al in "Applied Physics Letters", Vol 37, p 681, 1980 and by O. Mikami in "Electronic Letters", Vol 19, p 213, 1983. The third category involves the mirrors being produced by microcleaving of the faces, by hollowing out by selective chemical etching a channel between the substrate and the double heterostructure and by applying a manual or ultrasonic pressure bringing about the cleaving of the different layers of the double heterostructure, without there being any cleaving of the substrate and this is described more particularly by H.Blauvelt et al "Applied Physics Letters", Vol 40, p 289, 1981.

However, these prior art procedures all suffer from disadvantages.

The procedure using wet chemical etching generally leads to the formation of planes not having the required orientation, but which are inclined with respect thereto by a few degrees. This leads to a significant increase in the threshold current (50 to 100%), moreover, the results obtained are not very reproducible and are largely dependent on the mask used.

Dry reactive chemical etching (RIE), which acts both by chemical removal and physical removal of the material to be etched, leads to redeposition and contamination effects, so that the etched surfaces are rough and not flat. Moreover, the profile of the etched walls is dependent on several parameters (composition and pressure of the reactive gas used, thickness and characteristics of the masking material), so that the result obtained has an arbitrary character.

With regards to the procedure using microcleaving, this leads to the problem of the integration of the laser with a reaction photo diode located on the same substrate. The effectiveness of the coupling between the laser and the photo diode is essentially dependent on the distance between these two components. However, the minimum distance obtained up to now is prohibitive (approximately 140 microns). The signal detected by the photo diode is then very weak (less than 5 $\mu$A/mW)

The object of the invention is to surmount the difficulties encountered in the procedures referred to hereinbefore. To this end, the invention recommends the use of ionic machining for producing one or more laser mirrors under special masking conditions.

Ionic machining is an etching procedure widely used in the production of electronic devices (integrated circuits). It is a dry etching procedure using ions (e. g. argon) accelerated by an electric field in an ion gun more particularly of the Kaufman type. These accelerated ions drop onto a target, from which they expel the atoms by a momentum transfer mechanism.

Ionic machining has the essential feature of the directivity of the ion beam used. This directivity makes it possible to accurately control the slope of the etched wall. The interest of ionic machining for producing laser mirrors has been described by the Applicant at the conference entitled "Second European Conference on Integrated Optics", which was held in FLorence, Italy 17/18.10.1983 (Conference Publication No 227, pp 24–26).

The present invention relates to the conditions of performing this procedure and aims at improving the quality of the mirrors obtained. The improvement provided by the present invention mainly relates to the masking stage which takes place during the ionic bombardment operation.

The use of standard materials for the mask (photosensitive resin, silicon dioxide, titanium) did not prove to be very satisfactory for deep ionic machining (4 to 5 $\mu$m). In all case, the faces obtained are rough and their flatness mediocre. The Applicant has found that the origin of these objects was the poor definition of the mask used. To solve this problem, the Applicant has then proposed the use as the mask of a crystalline material layer, which is opaque to the ion beam, said layer being laterally defined by at least one face constituting the flank or side of the mask, said face being a crystallographic plane of the material used. Thus, the mask side is perfectly defined and the ionic machining operation which takes place through said mask leads to perfect etching, the etched face being smooth and flat.

More specifically, the invention relates to a process for machining semiconductor laser mirrors, in which a semiconductor structure undergoes ionic bombardment through a mask, whereof one side defines the location of the mirror to be machined, said process being characterized in that the mask is constituted by a crystalline layer, whose side is a crystallographic plane.

According to a first variant, the mask is obtained by the epitaxy of a crystalline layer on the semiconductor layer on the semiconductor structure, then by chemical etching of said layer to form the crystallographic plane.

According to a second variant, the mask is constituted by a thin bar or strip with cleaved faces placed on and preferably bonded to the semiconductor structure.

According to another feature of the invention, ionic bombardment takes place in an inclined direction with respect to the plane perpendicular to the semiconductor structure. It has been observed by the Applicant that with a normal incidence an etching plane was obtained which was slightly inclined with respect to the plane normal to the structure (angle of approximately 27°). By increasing the angle of incidence of the beam with respect to the normal, the obliquity of the machined face decreases. The inclination of the incident ion beam with respect to the sample to be machined can be brought about in two different ways, either by directly inclining the rotary substrate holder on which the sample is placed, or by placing the sample on a shim forming an angle $\alpha$ with the substrate holder which remains horizontal. A perfectly vertical face can be obtained for an incidence angle close to 23° by using the first procedure and of 12° by using the second procedure.

The feature of the invention can best be gathered from the following description of exemplified and in no way limitative embodiments and with reference to the attached drawings, wherein show :

FIG. 1. A first variant of the process using as the mask an epitactic layer with a crystallographic plane obtained by chemical etching.

Figure 2:
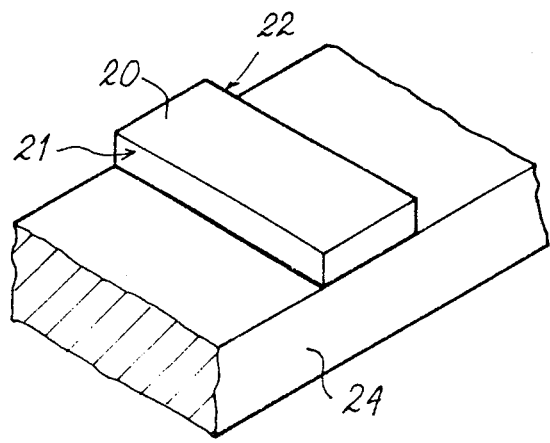
Figure 2:
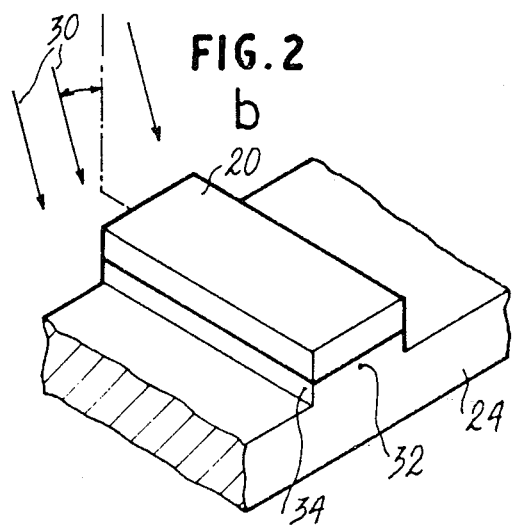
Figure 2:
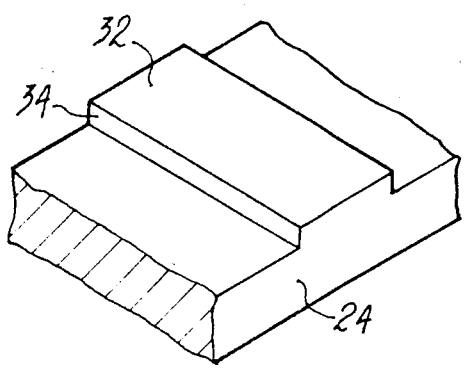

FIGS. 2a, 2b and 2c. A variant in which the mask used is constituted by a thin strip with cleaved faces bonded to the structure to be etched.

FIGS. 3a to 3f. Various stages of a process for producing a short cavity laser obtained solely by ionic machining.

FIGS. 4a to 4g. Various stages of a process for obtaining a short cavity laser obtained by the combined use of machining and chemical etching.

Figure 5:
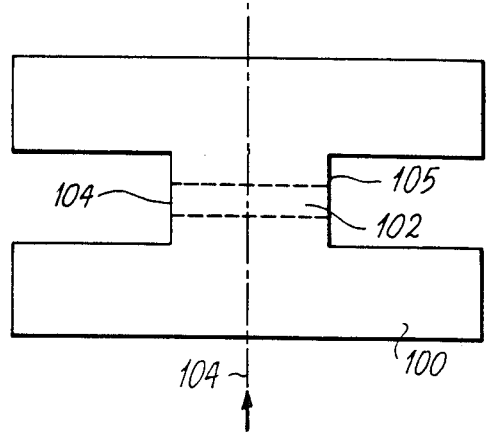

FIG. 5. A plan view of a mask making it possible to obtain a laser with one etched face and one cleaved face.

Figure 6:
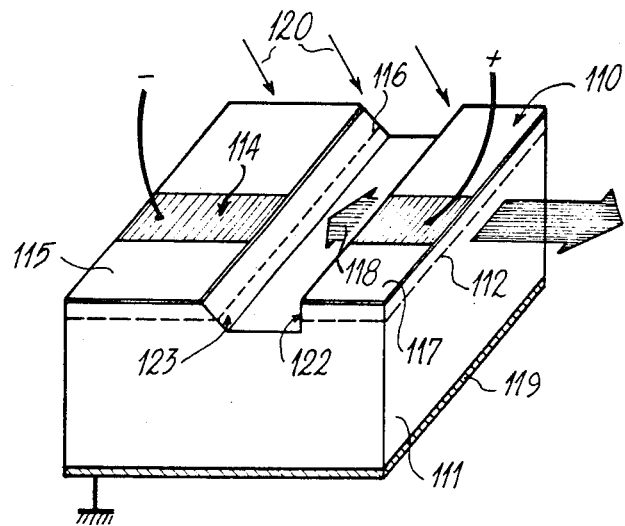

FIG. 6. A device having a laser and a photodetector integrated onto the same substrate.

Figure 7:
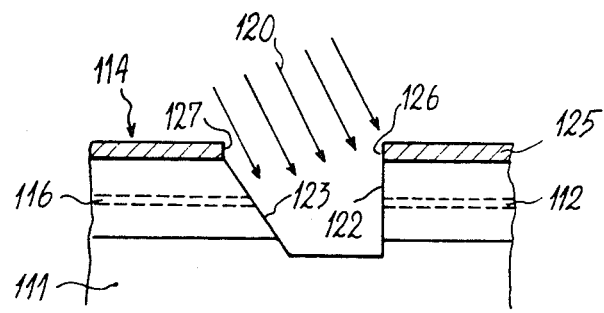

FIG. 7. A sectional view in detail of the preceding device.

Figure 8:
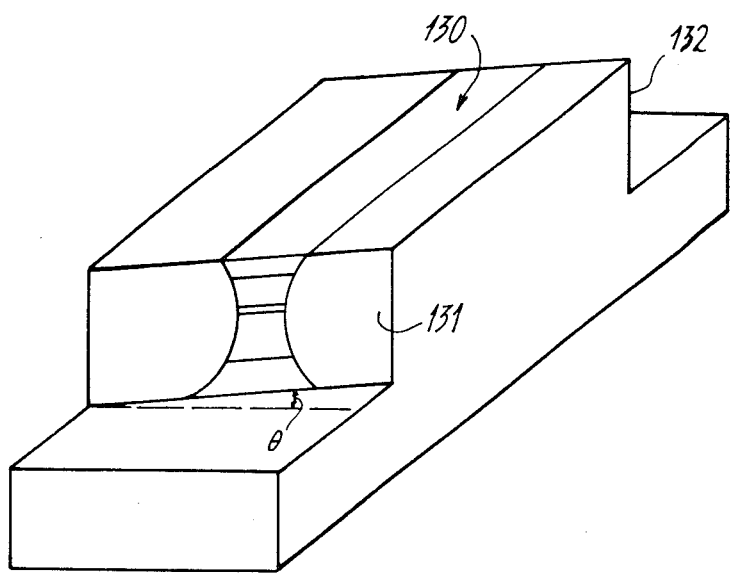

FIG. 8. A longitudinal multimode laser with mirrors inclined with respect to the ribbon.

Figure 9:
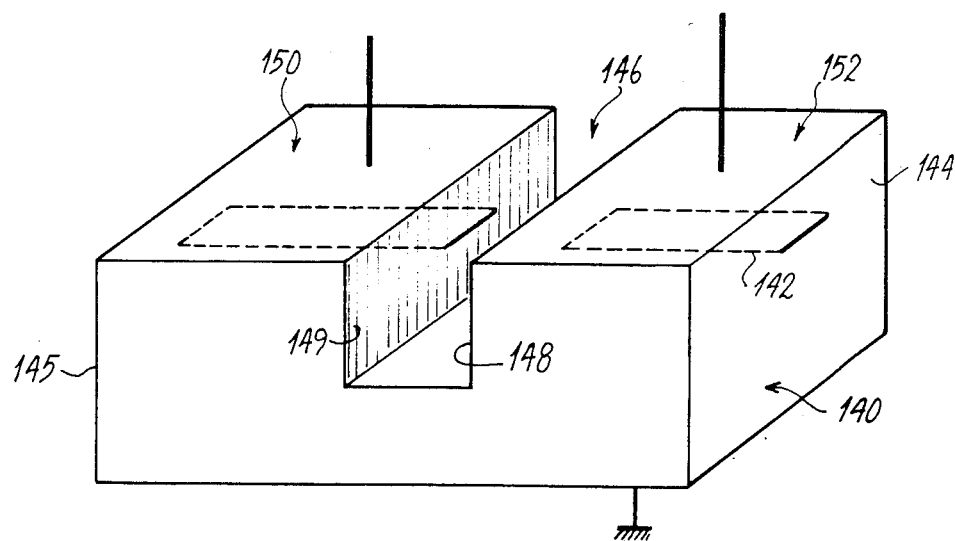

FIG. 9. A monofrequency laser formed from two coupled cavities integrated on the same substrate.

In the following description, the basic structure constituting the laser will not be described in detail because it is widely known. It is sufficient to point out that it is a double heterostructure generally having a first confinement layer, an active layer, a second confinement layer, a contact layer and a metal layer. The semiconductor layers are subject to proton bombardment for defining an active ribbon or tape.

FIG. 1 shows such a heterostructure 10 on which has been deposited an epitactic layer 12 serving as a mask for an etching operation indicated by arrows 14. According to one of the essential features of the invention, the epitactic layer 12 has a side 16, which is a crystallographic plane for the crystal forming the layer 12. This plane is obtained by chemical etching of layer 12. This chemical etching takes place in a conventional manner by protecting the epitactic layer 12 with a mask, whose edge defines the side or flank 16.

FIG. 2a illustrates another variant in which the mask is a thin bar or strip 20, cleaved along two faces 21, 22 and bonded to a heterostructure 24. This strip can e.g. be of GaAs and the crystallographic cleaving planes can e.g. correspond to crystalline orientations (110) or (110).

FIG. 2b illustrates the ionic machining stage using an ion beam 30, whereof the direction forms an angle $\alpha$ with the normal to the structure. This angle can be about 20°. This gives a step 32, whose side 34 is vertical and perfectly smooth and flat.

FIG. 2c illustrates the mesa 32 obtained after eliminating mask 20. Face 34 constitutes the reflecting face forming the mirror.

The production process described herein before makes it possible to obtain structures, which can only be obtained with considerable difficulty by conventional cleaving processes. Three examples of these structures will now be described and respectively relate to a short cavity laser, a structure with laser and photodetector or laser and optical guide integrated onto the same substrate and an integrated longitudinal multimode laser.

It is known that certain properties of lasers are closely linked with the cavity length. This is more particularly the case of the threshold current, the external quantum efficiency, the spacing between the longitudinal modes, the modulation frequency etc. Generally the shorter the cavity the better these characteristics, hence the interest in short lasers. However, due to these reduced dimensions, a difficulty occurs when fitting these lasers on heat dissipators and during the production of electrical connections. The process according to the invention makes it possible to obviate these difficulties in the manner shown in the two following examples.

A. SHORT LASER PRODUCED WITHOUT CHEMICAL ETCHING

Such a laser can be produced with the aid of a double heterostructure GaAlAs on GaAs or GaInAsP on InP.

Figure 3A:
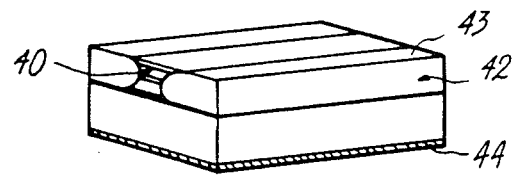
Figure 3B:
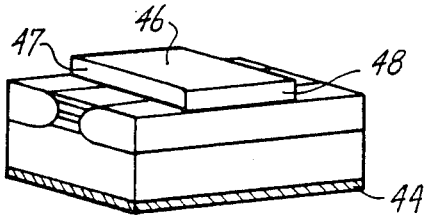
Figure 3C:
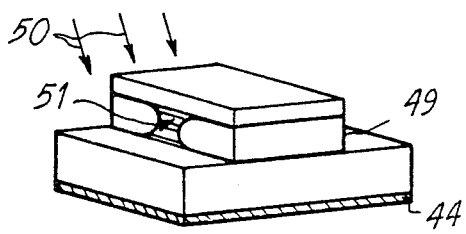
Figure 3D:
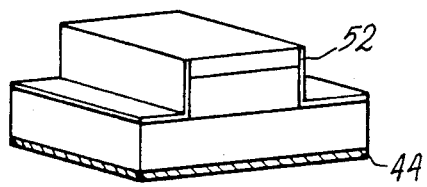
Figure 3E:
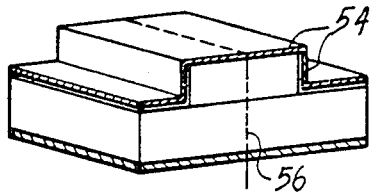
Figure 3F:
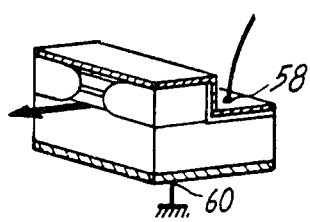

The different technical operations leading to such a laser are described in FIG. 3a to 3f, which respectively illustrate :

FIG. 3a :the formation of a ribbon structure 40 on a double heterostructure 42 and ohmic contacts on two faces 43, 44;

FIG. 3b :masking by a GaAs strip 46 with two cleaved faces 47, 48;

FIG. 3c :ionic machining by an apron ion beam 50 with an angle of incidence of 23°, the sample being directly placed on the inclined, rotating substrate holder and it is during this stage that the two reflecting faces 49 and 51 are formed;

FIG. 3d :the deposition of a dielectric layer 52 of thickness $\lambda$ in which $\lambda$is the operating wavelength of the laser FIG. 3e : the removal of the mask and the deposition of a metal layer (e.g. of gold) 54 on the complete surface;

FIG. 3f : finally the cleaving of the structure along plane 56 to form two lasers and contacting means : 58, 60. The laser cavity has one cleaved face (according to the prior art) and one machined face (according to the invention).

It is pointed out that as a result of the staircase configuration of the structure obtained, there is no contacting problem on the laser, because said contact can take place on that part of the substrate which is covered with gold.

As the ionic etching speed of GaAs is shorter than that of GaAlAs, the strip 46 forming the mask is constituted by a fine film of $Ga_xAl_{1-x}As$, with x exceeding approximately 0.5 and applied epitaxially to the substrate.

Tests carried out by the Applicant have made it possible to obtain lasers with one cleaved face and one machined face for which the measured threshold currents where typically 120 mA for 12 $\mu m$ wide ribbons and cavity length of 380 $\mu m$ and 18 mA for 5.5 $\mu m$ wide buried ribbons and cavity length of 60 $\mu m$. These threshold current values are equivalent to those obtained with lasers of the same length and two cleaved faces.

B. SHORT LASER PRODUCED BY A COMBINATION OF IONIC MACHINING AND CHEMICAL ETCHING

Such a laser can only be produced with the aid of a double heterostructure GaInAsP on InP because Inp has chemical etching properties differing from those of other III-V materials. Thus, there are chemical solutions such as pure hydrochloric acid (HCL) or a hydrochloric Acid-orthophiosphioric acid mixture (HCL—$H_3PO_4$), for which certain InP crystallographic planes have very low etching speeds compared with other planes. This difference in the etching speeds leads to planes being obtained for which the speeds are the lowest possible, so that these planes form the profiles of mesas obtained.

In the case of InP, planes (110) and (110) are perpendicular to he planes (001) of the substrate and have a quasi-zero etching speed. Following chemical etching in a pure HCL solution, rectangular mesas with straight edges can then be formed. However, no other solution has revealed identical effects on GaAs or GaInAsP.

Figure 4A:
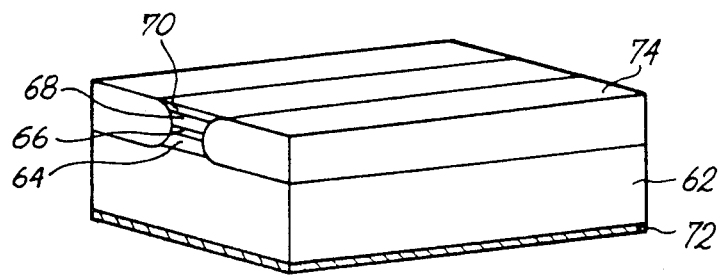
Figure 4B:
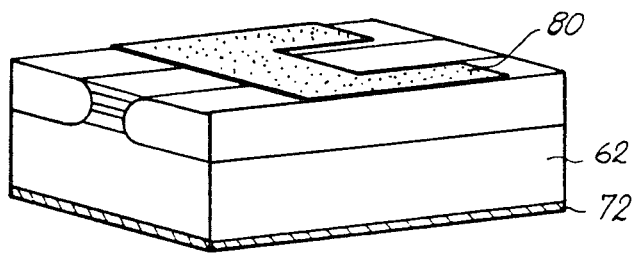
Figure 4C:
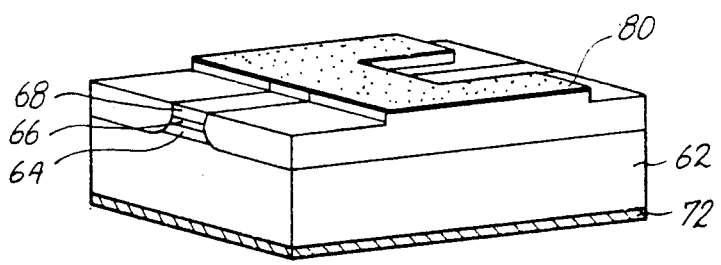
Figure 4:
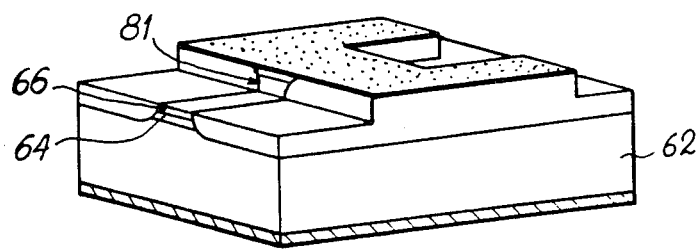
Figure 4:
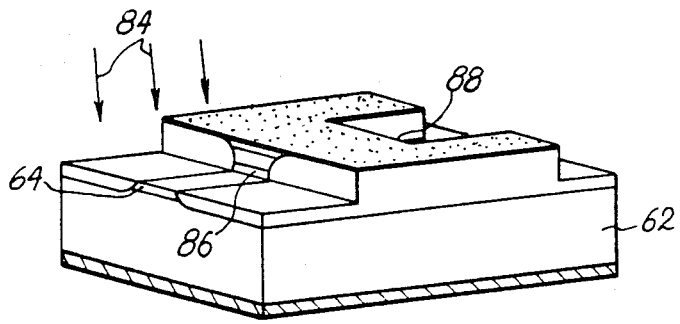
Figure 4:
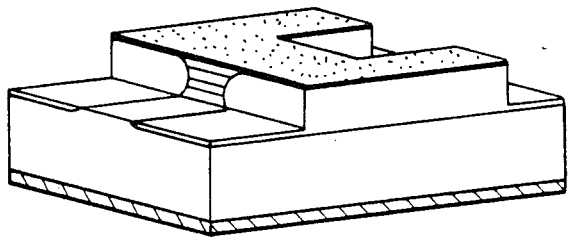
Figure 4:
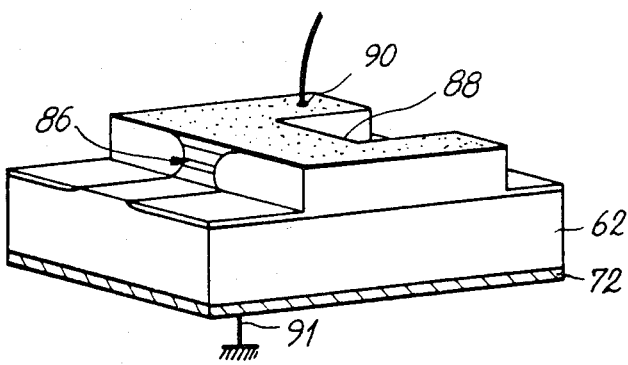

In the case of a double heterostructure, ionic machining of GaInAsP layers, followed by chemical etching of InP layers by HCL or HCL-$H_3PO_4$ solutions, leads to the formation of smooth, vertical, planar reflecting faces. The different operations are described in FIGS. 4a to 4g:

FIG. 4a definition of a double heterostructure GaInAsP on InP with an InP substrate 62, a first type n InP confinement layer 64, an active GaInAsP layer 66, a second type p InP confinement layer 68 and a type p GaInAs or GaInAsP contact layer 70, the structure being completed by metallizations 72, 74 forming ohmic contacts after producing the laser ribbon (be bombardment or burying);

FIG. 4b definition of a U-shaped dielectric ($Al_2O_3$) or resin mask 80 on the surface of the double heterostructure, such a mask being suitable for this stage because the etching depth is limited (less that 0.4 $\mu m$);

FIG. 4c : ionic etching of the upper metal layer 74 and the GaInAsP contact layer 70 up to the second InP confinement layer 68 ;

FIG. 4d : chemical etching of the second InP confinement layer 68 by a concentrated HCL or HCL—$H_3PO_4$ solution, said solutions not etching GaInAsP and it is this chemical etching which forms the crystallographic plane 81 in the second InP confinement layer 68;

FIG. 4e : ionic machining of the active GaInAsP layer 66 by an argon ion beam 84 of incidence 23°, the perfect crystallographic plane formed in the second InP confinement layer serving as a mask for said machining, as described relative to fig 1, said ionic machining forming the two reflecting faces 86, 88 of the laser;

FIG. 4f : selective chemical etching of the first confinement layer 64, in the same way as for the second confinement layer 68, followed by slight chemical etching for 5 to 10 seconds of all the layers of the double heterostructure using a selective solution formed from a 0.5% bromine - methanol mixture;

FIG. 4g : removing the resin mask 80, forming contacting means 90, 91.

In this variant of the process, the laser obtained has two reflecting faces 86, 88 obtained by ionic machining.

This structure causes the difficult problem of its connection to an optical fibre. Thus, as the edge of the laser (which is level with the active layer 86) does not coincide with the edge of substrate 62, it is difficult to bring into immediate contact with the laser an optical fibre with a diameter of a few dozen microns. Therefore, preference is given to a structure with only one face etched by ionic machining, whilst the other face is cleaved. The production stages are identical to those of the laser described hereinbefore, except t instead of using a U-shaped mask, a H-shaped mask is used. This mask is shown in place view in FIG. 5 and is designated 100. The active ribbon or tape is 102. Following the operations illustrated in FIGS. 4a to 4g, the structure is centrally cleaved along a cleaving plane 104. The location of this plane with respect to the two faces 104, 105 obtained by ionic machining determines the respective lengths of the cavities of the two lasers.

The process according to the invention also makes it possible to obtain structures which are more complex than those described hereinbefore. These are structures not only having a laser, but also an optical guide or a photodetector (e.g. a photodiode). The latter is included in a feedback loop used for regulating the supply current of the laser as a function of the detected power.

Such a device is shown in FIG. 6 and comprises a laser formed from a double heterostructure 110 placed on a substrate 111, said heterostructure more particularly having an active layer 112. Facing said laser, another heterostructure 114 acts as a photodetector, has an active layer 116 located in the plane of layer 120 and which receives part 118 of the radiation emitted by the laser. The assembly also has ohmic contacts 115, 117 and 119.

The groove separating the laser 110 and photodetector 114 is obtained in the case of a double InP heterostructure by the process according to the invention, i.e. by ionic machining through a mask having a crystallographic flank. The mask has an opening corresponding to the groove to be etched. As use is made of an ion beam 120 inclined with respect to the normal (to obtain in the manner described hereinbefore a reflecting face 122 perpendicular to the plan of the layers of heterostructure 122) on the photodiode side an etched face 123 is obtained, which is substantially inclined with respect to the normal plane. Far from being a defect, this arrangement makes it possible to eliminate any risk of feedback due to a reflection of beam 118 on face 123 with reinjection into laser 110. The production of the groove by ionic machining makes it possible to obtain a very small width of approximately 10 μm, which reinforces the coupling between laser 110 and photodiode 114.

In section, FIG. 7 shows the preceding elements during the ionic machining operation. On substrate 111, it is possible to see laser 110, photodiode 114, ion beam 120, reflecting face 122 perpendicular to the plane of the structure and inclined face 123. Mask 125 has sides 126 127 and which, according to the essential feature of the invention are crystallographic planes.

The index guidance ribbon lasers have made it possible to improve the performances of lasers compared with gain guidance structures (decrease in the threshold current, improvement in the power - current linearity, the stability of the modes and in particular the possibility of operating on a single longitudinal mode). However, it known that a longitudinal monomode laser is not suitable as a light source for transmissions by multimode fibres. A longitudinal multimode operation is preferred. Such an operation can be obtained in index guidance structures, provide that the ribbon is inclined with respect to the direction perpendicular to the plane of the cleared faces.

This arrangement can easily be obtained by machining two faces of the laser in two directions parallel to one another, but forming an angle of a few degrees with respect to the direction of the ribbon. This is illustrated in FIG. 8, where it is possible to see a buried ribbon-type structure 130, limited by faces 131, 132 inclined by an angle $\theta$ with respect to the plane perpendicular to the ribbon direction.

Despite the reservations referred to hereinbefore concerning single longitudinal mode operation, this operating procedure remains very important for high capacity communications systems. However, it is then necessary to stabilize the spectrum of the laser. Several solutions have been proposed for this, Such as short lasers, distributed reaction lasers, distributed network lasers, etc.

In a article entitled "High-speed direct single-frequency modulation with large tuning rate and frequency excursion in cleaved-coupled cavity semiconductor lasers" published in the journal "Applied Physics Letters", 42(8), 15.4.1983 by W. T. Tsang et al, a description is given of a device formed from two cleaved laser diodes optically coupled by the alignment of there active ribbons. The lengths of the two cavities are substantially equal (200 to 400 μm) and the distance separating them is less than 5 μm.

In such a device, one of the two diodes functions as a laser and the other as a frequency modulator, which makes it possible to stabilize the mode of oscillation. Such a device has made it possible to obtain stable longitudinal monomode spectra, even at high modulation frequencies.

However, these devices lead to the difficult problem of there reciprocal positioning and at a distance less than 5 μm, as well as that of the alignment of the two cavities.

FIG. 9 shows a device of this type obtained by a very simple production process calling on the aforementioned procedure according to the invention. The starting object is a heterostructure 140 with an active ribbon 142 and limited by two cleaved faces 144 and 145. Onto said structure is placed a mask having an opening of approximately 5 μm, which is perpendicular to the active ribbon direction. The sides of this mask are crystallographic planes. Ionic machining takes place through the mask opening and has the effect of hollowing out groove 146 defined by two faces 148, 149. On one side, an emitter laser 150 is obtained and on the other a modulator device 152. The two devices are integrated onto the same support.

The machining process described with the aid of these different examples is essentially based on a removal of matter by ionic bombardment. During the elastic impacts of the ions with the atoms of the target, the incident ions transfer significant momentums to the atoms of the crystal lattice and thus lead to the detachment thereof. However, these impacts also lead to crystal defects. The degree of disturbance of the bombarded surface is dependent on the accelerating voltage of the ions, the lower said voltage the less significant the defects produced, but the etching speed decreases with the voltage. Thus, a compromise must be found to obtain a satisfactory etching speed, whilst limiting the disturbance of the machine surface.

As the photoluminescence of the bombarded materials is sensitive to the crystal defects, a study of the variations of the intensity of this luminescence makes it possible to follow the evolution of the number of defects. The Applicant has shown that a first etching can be carried out with a voltage of 500 V and an ion current density of 0.5 mA/cm$^2$ for one hour, immediately followed by a second etching at a voltage of 300 V and an ion density of 0.2 mA/cm$^2$ for a few dozen minutes.

For accelerating voltages below 300 V, the divergence of the ion beam would increase, which would impair the directivtiy of machining.

The first etching at a high accelerating voltage and with a high argon pressure makes it possible to reach a depth of approximately 5 μm, which generally corresponds to the total thickness of the layers of a conventional double heterostructure. The second etching, at a lower accelerating voltage and lower argon pressure makes it possible to etch the surface obtained after the first etching, by producing a slightly disturbed surface.

The residual defects can be eliminated by immersing the sample for a few seconds in a chemical solution formed from one volume of $H_2SO_4$, 8 volumes of $H_2O_2$ and 1 volume of $H_2O$ at 0° C. in the case of GaAs, or in a 0.5% bromine - methanol mixture in the case of InP.

I claim:

1. Process for producing a semiconductor laser mirror in a planar semiconductor structure, comprising the steps of:
    forming a single crystalline layer by epitaxy on said semiconductor structure, said single crystalline layer having crystallographic planes;
    chemically etching said single crystalline layer along a crystallographic plane perpendicular to the plane of the semiconductor structure;
    carrying out an ionic etching of said semiconductor structure in a direction inclined with respect to said crystallographic plane through said single crystalline layer acting as a mask.

2. Process for producing a semiconductor laser mirror in a planar semiconductor structure, comprising the steps of:

forming a strip of a single crystalline material, said strip having at least one cleaved face which is a crystallographic plane;

bonding said strip to the semiconductor structure so that said crystallographic plane is perpendicular to the plane of the semiconductor structure;

carrying out an ionic etching of said semiconductor structure in a direction inclined with respect to said crystallographic plane through said strip acting as a mask.

* * * * *